United States Patent
Chen et al.

(10) Patent No.: US 7,492,237 B2
(45) Date of Patent: Feb. 17, 2009

(54) GAIN COMPENSATION CIRCUIT

(75) Inventors: Ruei Yuen Chen, China (TW); Yen Fen Lin, China (TW)

(73) Assignee: Microelectronics Technology Inc., China (TW)

( * ) Notice: Subject to any disclaimer, the term of this patent is extended or adjusted under 35 U.S.C. 154(b) by 36 days.

(21) Appl. No.: 11/852,529

(22) Filed: Sep. 10, 2007

(65) Prior Publication Data
US 2008/0272865 A1    Nov. 6, 2008

(30) Foreign Application Priority Data
May 2, 2007    (TW) .............................. 96115535 A

(51) Int. Cl.
*H01P 1/22*    (2006.01)
*H04B 1/38*    (2006.01)

(52) U.S. Cl. .................... 333/81 R; 330/310; 330/284; 330/289

(58) Field of Classification Search .............. 333/81 A, 333/81 R; 330/278, 289, 310, 272, 256, 330/266, 284
See application file for complete search history.

(56) References Cited

U.S. PATENT DOCUMENTS 6,418,301 B1 *    7/2002    Le et al. ....................... 455/73
7,133,651 B2 *    11/2006    Kwak ....................... 455/127.2

\* cited by examiner

*Primary Examiner*—Stephen E Jones
(74) *Attorney, Agent, or Firm*—Connolly Bove Lodge & Hutz LLP; Myron Keith Wyche

(57)    ABSTRACT

A gain compensation circuit comprises a first amplifier, a second amplifier, a filter, a first attenuator, a second attenuator and a third attenuator. The first amplifier is configured to amplify an input signal of the microwave signal processor. The filter is disposed between the first and second amplifiers. The first attenuator is disposed between the first amplifier and the filter for reducing return loss of the microwave signal processor. The second attenuator is disposed between the second amplifier and the filter for reducing return loss of the microwave signal processor. The third attenuator is electrically connected to the output of the second amplifier for reducing noise figure of the microwave signal processor and providing first and second gain compensations. The first gain compensation keeps the gain of the microwave signal processor constant under various temperatures, and the second gain compensation adjusts a nominal gain of the microwave signal processor.

10 Claims, 4 Drawing Sheets

GAIN COMPENSATION CIRCUIT

BACKGROUND OF THE INVENTION

1. Field of the Invention

The present invention relates to a gain compensation circuit, and more particularly to a gain compensation circuit applied to an outdoor microwave transceiver.

2. Description of the Related Art

Generally, the gain of a normal transceiver will decrease when it is operated at high temperature (about 40° C. to 60° C.), but increase at low temperature (below about 20° C.). Therefore, for some outdoor satellite transceivers which often operate in suboptimal environmental conditions, unless some gain compensation addressing temperature variation is performed, the gain of the transceiver will vary with the environmental temperature, causing signal distortion, and deteriorating communication quality. Therefore, it is common practice to design a compensation circuit which is able to suppress the gain of the transceiver at low temperature but enhance the gain of the transceiver at high temperature.

As far as the gain compensation of the outdoor transceiver is concerned, a passive attenuator cooperating with a thermistor is commonly used to act as a gain compensation mechanism of the transceiver. However, such structure will degrade the quality of noise figure of the transceiver due to gain attenuation. Another known method is to use a special feature of gain relating to temperature of an active amplifier to achieve the effect of gain compensation. However, this has the drawback of a high material cost.

SUMMARY OF THE INVENTION

The present invention provides a gain compensation circuit which is applied in a microwave signal processor. The gain compensation circuit includes a thermistor exhibiting a negative temperature coefficient and a passive attenuator with variable resistance. Therefore, the microwave signal processor obtains a constant gain even under varying temperatures, increases gain compensation range and effectively reduces degradation of noise figure.

The gain compensation circuit according to an embodiment of the present invention, applied to a microwave signal processor, comprises a first amplifier, a second amplifier, a filter, a first attenuator, a second attenuator and a third attenuator. The first amplifier is configured to amplify an input signal of the microwave signal processor. The filter is disposed between the first and second amplifiers. The first attenuator is disposed between the first amplifier and the filter for reducing return loss of the microwave signal processor. The second attenuator is disposed between the second amplifier and the filter for reducing return loss of the microwave signal processor. The third attenuator is electrically connected to the output of the second amplifier for reducing noise figure of the microwave signal processor and providing first and second gain compensations. The first gain compensation keeps the gain of the microwave signal processor constant under various temperatures, and the second gain compensation adjusts a nominal gain of the microwave signal processor.

BRIEF DESCRIPTION OF THE DRAWINGS

The invention will be described according to the appended drawings in which.

PREFERRED EMBODIMENT OF THE PRESENT INVENTION

Figure 1:
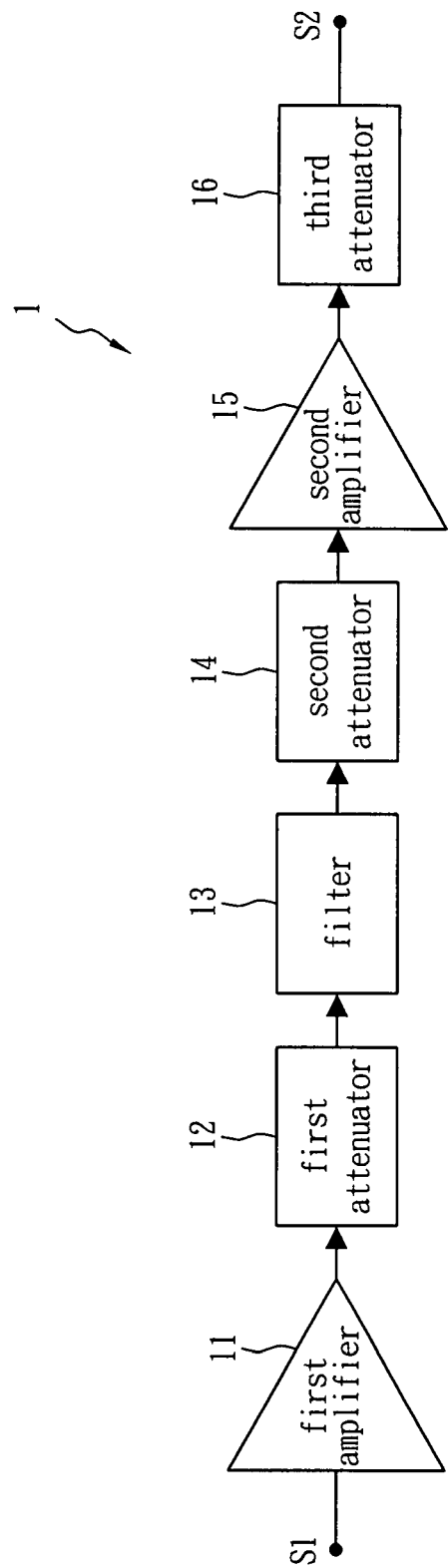
FIG. 1 shows a hint diagram of a gain compensation circuit in accordance with one embodiment of the present invention.
Figure 3:
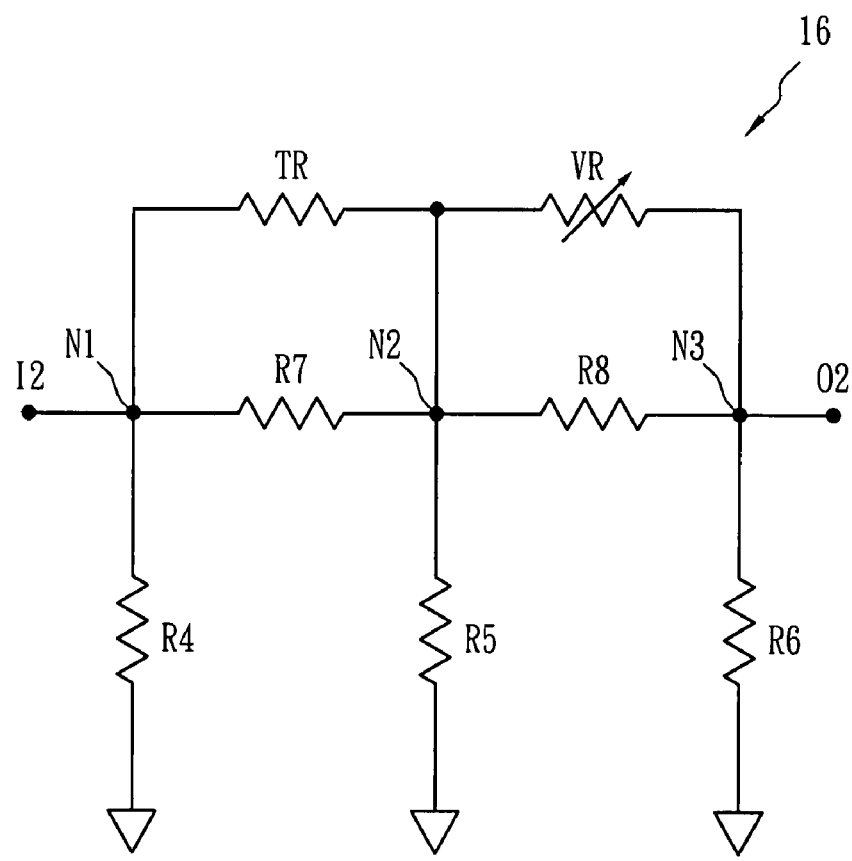
FIG. 3 shows a circuit of the third attenuator according to one embodiment of the present invention.

FIG. 1 shows a hint diagram of a gain compensation circuit 1 in accordance with one embodiment of the present invention. The gain compensation circuit 1 is applied to a microwave signal processor and includes a first amplifier 11, a first attenuator 12, a filter 13, a second attenuator 14, a second amplifier 15 and a third attenuator 16. The first amplifier 11 and the second amplifier 15 are used to amplify an input signal S1 of the microwave signal processor so as to generate an output signal S2. The filter 13 is disposed between the first amplifier 11 and the second amplifier 15 so as to remove noises created by the input signal S1 through the first amplifier 11 and the first attenuator 12. The second attenuator 14 is disposed between the filter 13 and the second amplifier, while the first attenuator 12 and the second attenuator 14 are used to reduce the return loss of the microwave signal processor. The third attenuator 16 is disposed behind the second amplifier 15 for reducing the noise figure of the microwave signal processor. The third attenuator 16 also provides first and second gain compensations, where the first gain compensation is used to compensate the gain of the microwave signal processor so as to maintain a constant gain under variable environmental temperatures, and the second gain compensation is used to adjust a nominal gain of the microwave signal processor. The third attenuator 16 includes a variable resistor VR (as shown in FIG. 3), which is used to adjust the second gain, and thus further affects the nominal gain of the manufactured microwave signal processor under a normal temperature (about 25° C.). By means of the above method, mass-production microwave signal processors can each have a consistent nominal gain, and the variation of the gain relating to temperature is consistent as well. In addition, the third attenuator 16 includes a thermistor TR exhibiting negative temperature coefficient (as shown in FIG. 3); the resistance of the thermistor TR is inversely proportional to temperature so as to control the attenuation amount of the third attenuator 16, which further affects the first gain. In this embodiment, the first gain compensation exhibits a positive temperature coefficient characteristic, which means the gain is proportional to temperature. Another function of the first amplifier 11 and the second amplifier 15 is to restore the gain which is attenuated after the first attenuator 12 and the second attenuator 14 are added and to achieve the effect of amplifying signals. The gain variance of the first amplifier 11, the second amplifier 15 and a radio frequency carrier amplifier (not shown) which is caused by temperature variance (e.g., generally, the gain of an active amplifier is lower in high temperature than in low temperature) will be compensated by the third attenuator 16 so as to fix the gain of the microwave signal processor and to prevent signal distortion due to temperature variance.

Figure 2:
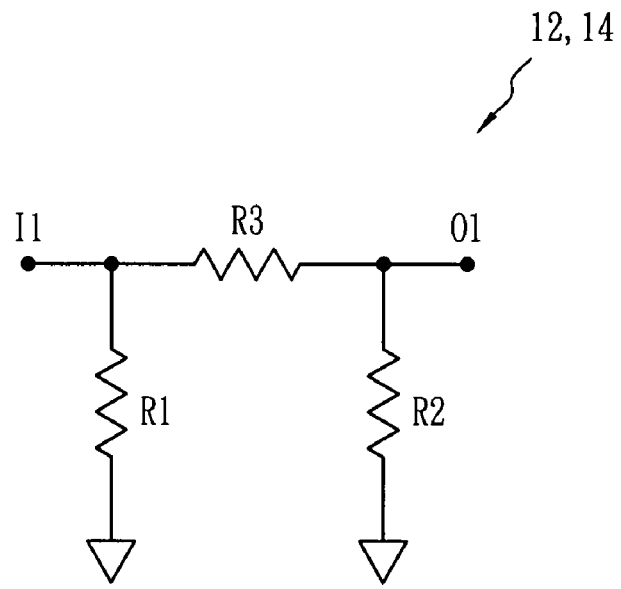
FIG. 2 shows a circuit of the first attenuator or the second attenuator according to one embodiment of the present invention.

FIG. 2 shows a circuit of the first attenuator 12 or the second attenuator 14 according to one embodiment of the present invention. The first attenuator 12 or the second attenuator 14 is a π-type attenuator, which includes two grounding resistors R1, R2 and a parallel resistor R3. The two grounding resistors R1, R2 each has an end connecting to ground and the other end connecting to the parallel resistor R3. Furthermore, the two ends of the parallel resistor R3 act as input end I1 and output end O1 of the first attenuator 12 (or the second attenuator 14).

FIG. 3 shows a circuit of the third attenuator 16 according to one embodiment of the present invention. The third attenuator 16 includes a thermistor TR exhibiting negative temperature coefficient characteristic, a variable resistor VR and three grounding resistors R4-R6. The thermistor TR connects to a first parallel resistor R7 in parallel between the first node N1 and second node N2. The variable resistor VR connects to a second parallel resistor R8 in parallel between the second node N2 and third node N3. Each of the three grounding resistors R4-R6 grounds at one end and connects to the first, second or third nodes N1-N3, respectively, at the other end. The first node N1 and the third node N3 act as the input end I2 and output end O2 of the third attenuator 16, respectively. As the temperature increases, the resistance of the thermistor TR exhibiting negative temperature coefficient characteristic decreases so as to reduce the attenuation amount of the third attenuator 16. As the temperature decreases, the resistance of the thermistor TR increases so as to raise the attenuation amount of the third attenuator 16.

Figure 4:
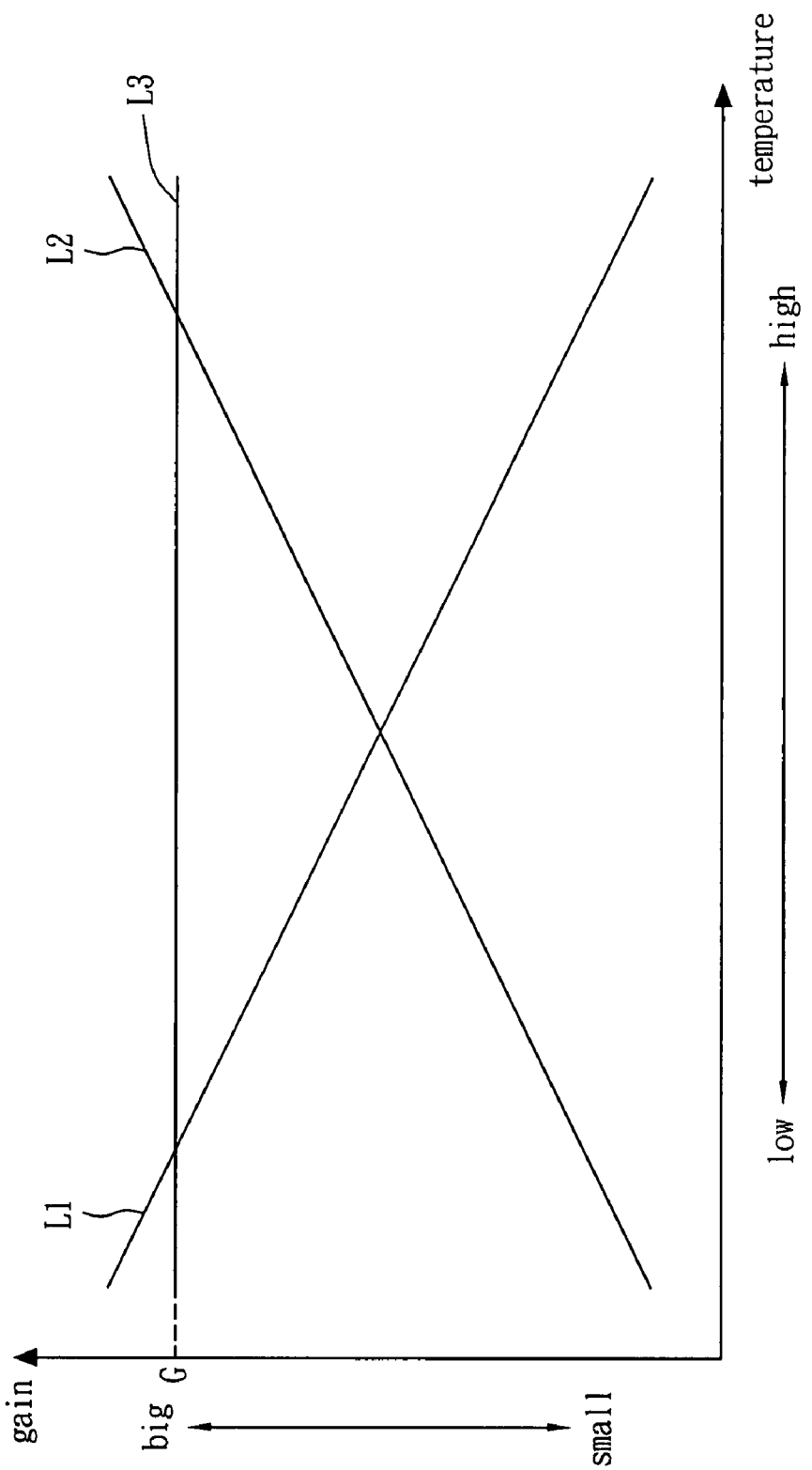
FIG. 4 shows a diagram of the gain relating to temperature.

FIG. 4 shows a diagram of the gain relating to temperature. Generally, the gain of the microwave signal transmitter or receiver is inversely proportional to temperature (as shown by line L1), while the line L2 shows gain relating to temperature characteristic of the third attenuator 16 in FIG. 1. The line L3 represents a constant gain G which is unaffected by temperature, and is created by combining the general microwave signal transmitter in FIG. 1 with the third attenuator 16. Obviously, the slope of L2 or the amount of the constant gain G could be determined by suitably selecting resistors R4-R8 of the third attenuator 16.

Figure 5A:
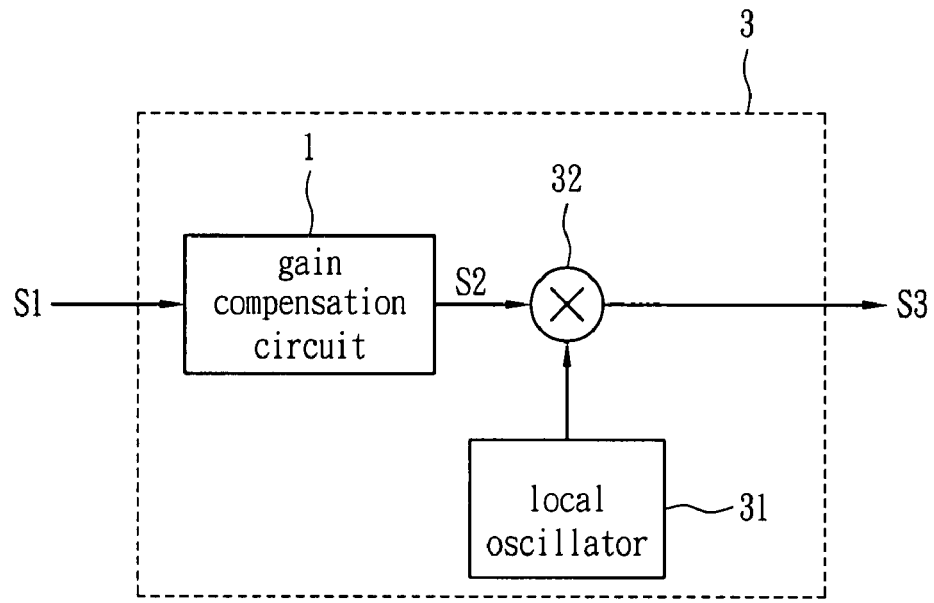
FIG. 5(a) shows a microwave signal transmitter using the gain compensation circuit in accordance with one embodiment of the present invention.
Figure 5B:
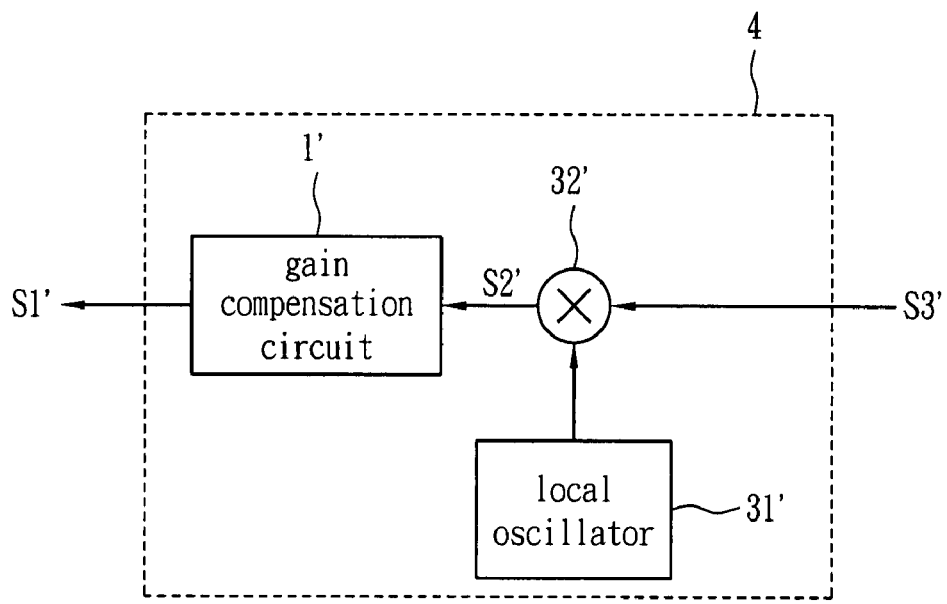
FIG. 5(b) shows a microwave signal receiver using the gain compensation circuit in accordance with one embodiment of the present invention.

FIG. 5(a) shows a microwave signal transmitter 3 using the gain compensation circuit 1 in accordance with one embodiment of the present invention. An input signal S1 is of a middle frequency at about 1 GHz, which is suitably amplified into signal S2 through the gain compensation circuit 1, but maintains it's a constant frequency. Namely, the gain compensation circuit 1 is operated in a middle-frequency bandwidth. The local oscillator 31 is used to send out a frequency at about 13 GHz to a mixer 32, so as to raise the frequency of the signal S2 to 14 GHz and thus form a radio frequency output signal S3. When the microwave signal transmitter 3 is used outdoors, even if the temperature varies, the entire gain of the microwave signal transmitter 3 remains unchanged by means of the auto gain compensation of the gain compensation circuit 1. Referring to FIG. 5(b), the present invention can also apply to microwave signal receivers 4. The microwave signal receiver 4 receives a high frequency signal S3' at about 12 GHz. Thereafter, cooperating with a signal at about 11 GHz provided by a local oscillator 31', a mixer 32' reduces the radio frequency signal S3' into a middle frequency signal S2' at about 1 GHz. The middle frequency signal S2' goes through a gain compensation circuit 1' to be amplified and formed as a middle frequency output signal S1'. Please note that the microwave signal transmitter 3 in FIG. 5(a) and the microwave signal receiver 4 in FIG. 5(b) could both provide a constant gain within a specific temperature range. The desired specific temperature range and the constant gain can be obtained through suitable selection of thermistor (TR in FIG. 3) or resistors (R1-R8 in FIGS. 1 and 2).

In conclusion, the gain compensation circuit which is applied in a microwave signal processor uses a thermistor exhibiting negative temperature coefficient and a passive attenuator with a variable resistor so as to obtain a constant gain. In comparison with the prior art, the present invention not only improves noise figure of the microwave signal processor, but also completely controls the gain variance of the microwave signal processor by adding a variable resistor VR to adjust the nominal gain of the microwave signal processor.

The above-described embodiments of the present invention are intended to be illustrative only. Numerous alternative embodiments may be devised by persons skilled in the art without departing from the scope of the following claims.

What is claimed is:

1. A gain compensation circuit, applied to a microwave signal processor, the gain compensation circuit comprising:
    a first amplifier configured to amplify an input signal of the microwave signal processor;
    a second amplifier;
    a filter disposed between the first and second amplifiers;
    a first attenuator disposed between the first amplifier and the filter for reducing return loss of the microwave signal processor;
    a second attenuator disposed between the second amplifier and the filter for reducing return loss of the microwave signal processor; and
    a third attenuator electrically connected to the output of the second amplifier for reducing noise figure of the microwave signal processor and providing first and second gain compensations;
    wherein the first gain compensation keeps the gain of the microwave signal processor constant under various temperatures, and the second gain compensation adjusts a nominal gain of the microwave signal processor.

2. The gain compensation circuit of claim 1, wherein the microwave signal processor is used outdoors.

3. The gain compensation circuit of claim 1, wherein the third attenuator includes a variable resistor, wherein the variable resistor is used to adjust the second gain compensation and to adjust the nominal gain at normal temperature.

4. The gain compensation circuit of claim 1, wherein the third attenuator includes a thermistor exhibiting a negative temperature coefficient characteristic, the thermistor is used to adjust the first gain compensation exhibiting a positive temperature coefficient characteristic.

5. The gain compensation circuit of claim 1, wherein the third attenuator comprises:
    a thermistor exhibiting a negative temperature coefficient characteristic, the thermistor connected to a first parallel resistor in parallel;
    a variable resistor connected to one end of the thermistor, wherein the variable resistor connects a second parallel resistor in parallel; and
    three grounding resistors each having an end connected to ground and the other end connected to an end of the thermistor or variable resistor.

6. The gain compensation circuit of claim 1, wherein the microwave signal processor is a microwave signal transmitter.

7. The gain compensation circuit of claim 1, wherein the first gain exhibits a positive temperature coefficient characteristic.

8. The gain compensation circuit of claim 1, wherein the first and second attenuators are π-type attenuators.

9. The gain compensation circuit of claim 1, wherein each of the first and second attenuators comprises:

two grounding resistors each having an end connected to ground; and
a parallel resistor connected to the other ends of the two grounding resistors.

10. The gain compensation circuit of claim 1, which is operated in a middle-frequency bandwidth.

\* \* \* \* \*